(12) United States Patent
Ker et al.

(10) Patent No.: US 7,880,195 B2
(45) Date of Patent: Feb. 1, 2011

(54) ELECTROSTATIC DISCHARGE PROTECTION DEVICE AND RELATED CIRCUIT

(75) Inventors: Ming-Dou Ker, Hsinchu County (TW); Yuan-Wen Hsiao, Tai-Chung (TW); Chang-Tzu Wang, Taipei (TW)

(73) Assignees: United Microelectronics Corp., Science-Based Industrial Park, Hsin-Chu (TW); National Chiao-Tung University, Hsinchu (TW)

( * ) Notice: Subject to any disclaimer, the term of this patent is extended or adjusted under 35 U.S.C. 154(b) by 121 days.

(21) Appl. No.: 12/329,636

(22) Filed: Dec. 8, 2008

(65) Prior Publication Data

US 2010/0140659 A1    Jun. 10, 2010

(51) Int. Cl.
   *H01L 29/66* (2006.01)
(52) U.S. Cl. .................. 257/173; 257/355; 257/360; 257/E29.211
(58) Field of Classification Search ............... 257/173, 257/355, 360, E29.211
   See application file for complete search history.

(56) References Cited

U.S. PATENT DOCUMENTS

| 6,448,123 | B1 | 9/2002 | Lee |
| 6,507,471 | B2 | 1/2003 | Colclaser |
| 6,661,060 | B2 | 12/2003 | Lee |
| 6,690,557 | B2 | 2/2004 | Hung |
| 6,693,780 | B2 | 2/2004 | Spehar |
| 7,170,727 | B2 | 1/2007 | Richardson |
| 2003/0042498 | A1 | 3/2003 | Ker |
| 2003/0076636 | A1 | 4/2003 | Ker |

*Primary Examiner*—Tan N Tran
(74) *Attorney, Agent, or Firm*—Winston Hsu; Scott Margo (57) ABSTRACT

An ESD protection device comprises a P-type substrate, a first substrate-triggered silicon controlled rectifiers (STSCR) disposed in the P-type substrate and a second STSCR disposed in the P-type substrate. The first STSCR comprises a first N-well, a first P-well, a first $N^+$ diffusion region, a first $P^+$ diffusion region, and a first trigger node. The second STSCR comprises a second N-well electrically connected to the first N-well, a second P-well electrically connected to the first P-well, a second $N^+$ diffusion region electrically connected to the first $P^+$ diffusion region, a second $P^+$ diffusion region electrically connected to the first $N^+$ diffusion region, and a second trigger node. A layout area of an integrated circuit and a pin-to-pin ESD current path can be reduced.

19 Claims, 6 Drawing Sheets

FIG. 8

ELECTROSTATIC DISCHARGE PROTECTION DEVICE AND RELATED CIRCUIT

BACKGROUND OF THE INVENTION

1. Field of the Invention

The present invention relates to an electrostatic discharge (ESD) protection device and a related circuit, and more particularly, to an ESD protection device using only two substrate-triggered silicon-controlled rectifiers (STSCRs) and a related circuit.

2. Description of the Prior Art

Electrostatic discharge (ESD) protection has been a very important reliability issue in integrated circuits (ICs). To prevent the ICs from being damaged during ESD stresses, ESD protection circuits are needed for all input/output (I/O) pins. However, the ESD protection circuits inevitably introduce negative impacts to RF performance due to their parasitic capacitance. As the operating frequency of RF circuits increases, performance degradation due to ESD protection circuits becomes more serious. Silicon-controlled rectifier (SCR) is demonstrated to be suitable for ESD protection design for RF ICs, because it has both high ESD robustness and low parasitic capacitance under a small layout area.

Figure 1:
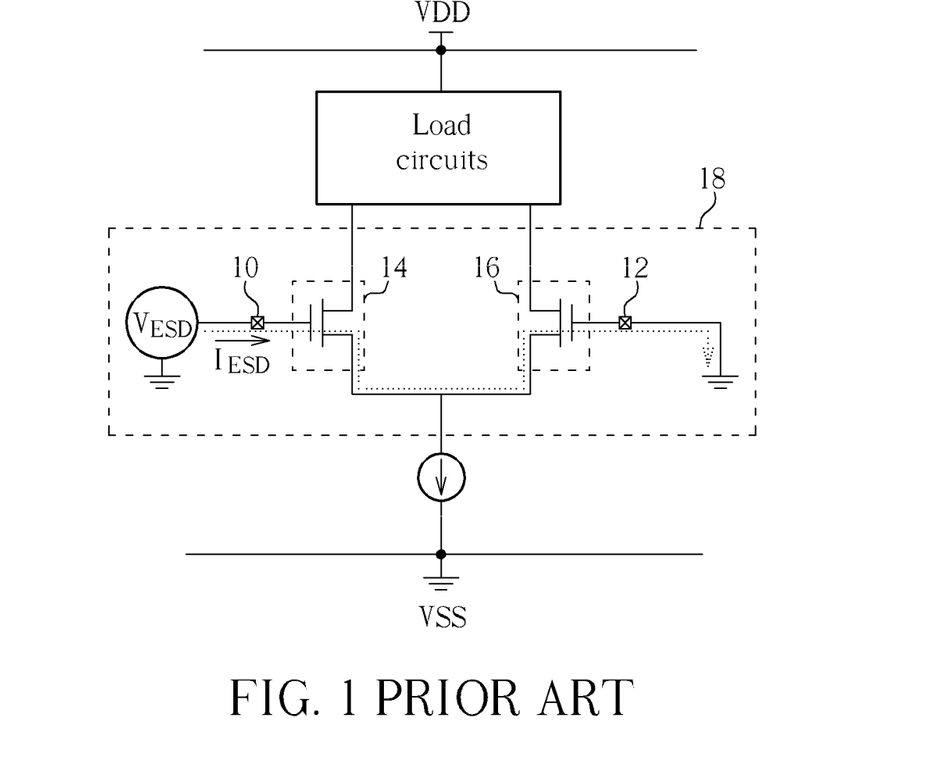
FIG. 1 is a circuit diagram illustrating an ESD current during pin-to-pin ESD stresses in the differential input stage of an RF circuit.

Besides positive-to-VSS mode (PS-mode), positive-to-VDD mode (PD-mode), negative-to-VSS mode (NS-mode) and negative-to-VDD (ND-mode) ESD stresses, there is an additional pin-to-pin ESD stress, which is specified in the standards for the analog or RF circuits with differential input stages so as to verify the ESD robustness of the differential analog or RF input pins. During the pin-to-pin ESD stresses, the positive or negative ESD voltage is applied to one of the differential input pads with the other differential input pad relatively grounded. During such a pin-to-pin ESD stress, all the other pins including the VDD and VSS pins are floating. Please refer to FIG. 1. FIG. 1 is a circuit diagram illustrating an ESD current path during pin-to-pin ESD stresses in the differential input stage of an RF circuit. As shown in FIG. 1, if the connection between the two differential input pads 10, 12 and VDD or VSS power terminal has a long metal line, the gate oxides of the metal oxide semiconductor (MOS) transistors 14, 16 in the differential input stage 18 will be easily damaged by ESD current $I_{ESD}$ indicated by a dot line shown in FIG. 1. In addition, the pin-to-pin ESD stress is critical for the differential input stage 18 in CMOS processes because the differential input pads 10, 12 are often connected to the gate electrodes of the MOS transistors 14, 16 in a differential pair. When one of the differential input pads 14 is zapped by ESD with the other differential input pad 16 grounded, the ESD voltage must be quickly clamped in order not to damage the gate oxide of MOS transistors 14, 16. With the advance of CMOS processes, the gate oxide breakdown voltage continuously decreases.

SUMMARY OF THE INVENTION

It is therefore a primary objective of the present invention to provide an ESD protection device and a related circuit to reduce pin-to-pin ESD current path and reduce layout area of ESD protection circuit.

According to a preferred embodiment of the present invention, an ESD protection device is provided. The ESD protection device includes a P-type substrate, a first substrate-triggered silicon controlled rectifier (STSCR) disposed in the P-type substrate and a second STSCR disposed in the P-type substrate. The first STSCR comprises a first N-well disposed in the P-type substrate, a first P-well disposed adjacent to the first N-well in the P-type substrate, a first $N^+$ diffusion region disposed in the first P-well, a first $P^+$ diffusion region disposed in the first N-well, and a first trigger node disposed in the P-type substrate. The second STSCR comprises a second N-well disposed in the P-type substrate, a second P-well disposed adjacent to the second N-well in the P-type substrate, a second $N^+$ diffusion region disposed in the second P-well, a second $P^+$ diffusion region disposed in the second N-well, and a second trigger node disposed in the P-type substrate. The first N-well is electrically connected to the second N-well, and the first P-well is electrically connected to the second P-well. The second $N^+$ diffusion region is electrically connected to the first $P^+$ diffusion region, and the second $P^+$ diffusion region is electrically connected to the first $N^+$ diffusion region.

According to a preferred embodiment of the present invention, an ESD protection circuit electrically connected to a differential stage with a first differential input/output (I/O) pad and a second differential I/O pad, a low power terminal and a high power terminal is provided. The ESD circuit comprises an ESD protection device and an ESD-detection circuit electrically connected between the high power terminal and the low power terminal. The first $N^+$ diffusion region and the second $P^+$ diffusion region are electrically connected to the first differential I/O pad, and the first $P^+$ diffusion region and the second $N^+$ diffusion region are electrically connected to the second differential I/O pad. The first N-well and the second N-well are electrically connected to the high power terminal, and the first P-well and the second P-well are electrically connected to the low power terminal.

The present invention provides the ESD protection device with only two STSCR devices used for the two differential I/O pads. The ESD protection device with only two STSCR devices can provide ESD protection against not only the PS-mode, PD-mode, NS-mode, and ND-mode ESD stresses, but also the pin-to-pin ESD stresses so as to reduce the layout area for ESD protection circuit and reduce the pin-to-pin ESD current path.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
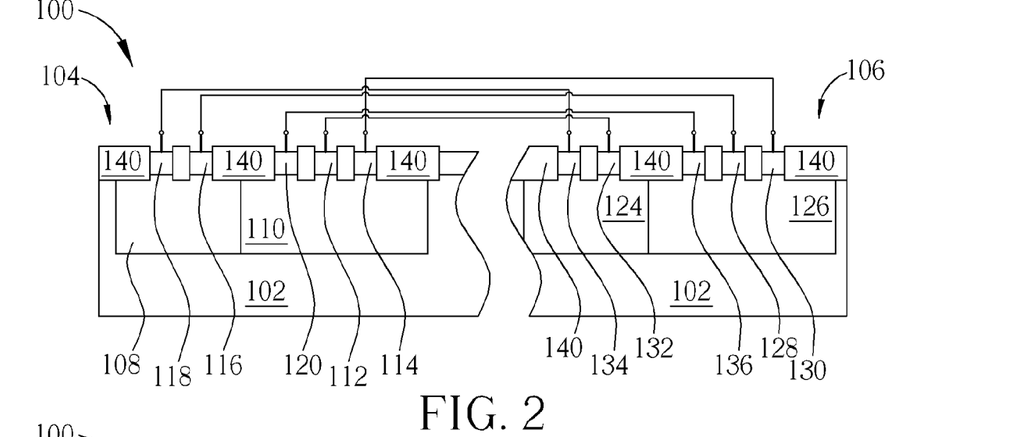
FIG. 2 is a cross-sectional schematic diagram illustrating an ESD protection device according to a first preferred embodiment of the present invention.

Please refer to FIG. 2. FIG. 2 is a cross-sectional schematic diagram illustrating an ESD protection device according to a first preferred embodiment of the present invention. As shown in FIG. 2, the ESD protection device 100 includes a P-type substrate 102, a first substrate-triggered silicon controlled rectifier (STSCR) 104 disposed in the P-type substrate 102 and a second STSCR 106 disposed in the P-type substrate 102. The first STSCR 104 includes a first N-well 108 disposed in the P-type substrate 102, a first P-well 110 disposed adjacent to the first N-well 108 in the P-type substrate 102, a first $N^+$ diffusion region 112 disposed in the first P-well 110, a first $P^+$ diffusion region 116 disposed in the first N-well 108, and a first trigger node 120 disposed in the P-type substrate 102. The first $P^+$ diffusion region 116, the first N-well 108, the first P-well 110 and the first $N^+$ diffusion region 112 form a first lateral silicon controlled rectifier (lateral SCR). The first $P^+$ diffusion region 116 can be referred as an anode of the first STSCR 104, and the first $N^+$ diffusion region 112 can be referred as a cathode of the first STSCR 104. The second STSCR 106 includes a second N-well 124 disposed in the P-type substrate 102, a second P-well 126 disposed adjacent to the second N-well 124 in the P-type substrate 102, a second $N^+$ diffusion region 128 in the second P-well 126, a second $P^+$ diffusion region 132 in the second N-well 124, and a second trigger node 136 disposed in the P-type substrate 102. The second $P^+$ diffusion region 132, the second N-well 124, the second P-well 126 and the second $N^+$ diffusion region 128 form a second lateral SCR. The second $P^+$ diffusion region 132 can be referred as an anode of the second STSCR 106, and the second $N^+$ diffusion region 128 can be referred as a cathode of the second STSCR 106.

In the first STSCR 104, the first $P^+$ diffusion region 116, the first N-well 108, the first P-well 110 and the first $N^+$ diffusion region 112 constitute a SCR current path. In addition, the first STSCR 104 further comprises a third $P^+$ diffusion region 114 disposed in the first P-well 110 and a third $N^+$ diffusion region 118 disposed in the first N-well 108. The first $P^+$ diffusion region 116, the first N-well 108 and the third $N^+$ diffusion region 118 constitute a diode current path, the third $P^+$ diffusion region 114, the first P-well 110 and the first $N^+$ diffusion region 112 constitute a diode current path, and the first P-well 110 and the first N-well 108 also constitute a diode current path. Similarly, in the second STSCR 106, the second $P^+$ diffusion region 132, the second N-well 124, the second P-well 126 and the second $N^+$ diffusion region 128 also constitute a SCR current path. In addition, the second STSCR 106 further comprises a fourth $P^+$ diffusion region 130 disposed in the second P-well 126, and a fourth $N^+$ diffusion region 134 disposed in the second N-well 124. The second $P^+$ diffusion region 132, the second N-well 124 and the fourth $N^+$ diffusion region 134 constitute a diode current path, the fourth $P^+$ diffusion region 130, the second P-well 126 and the second $N^+$ diffusion region 128 constitute a diode current path, and the second P-well 126 and the second N-well 124 also constitute a diode current path.

In the ESD protection device 100, the anode of the first STSCR 104, which is the first $P^+$ diffusion region 116, is electrically connected to the cathode of the second STSCR 106, which is the second $N^+$ diffusion region 128. The cathode of the first STSCR 104, which is the first $N^+$ diffusion region 112, is electrically connected to the anode of the second STSCR 106, which is the second $P^+$ diffusion region 132. The first P-well 110 is electrically connected to the second P-well 126 through the third $P^+$ diffusion region 114 and the fourth $P^+$ diffusion region 130, and the first N-well 108 is electrically connected to the second N-well 124 through the third $N^+$ diffusion region 118 and fourth $N^+$ diffusion region 134. In addition, the first $N^+$ diffusion region 112, the first $P^+$ diffusion region 116, the second $P^+$ diffusion region 132, the second $N^+$ diffusion region 128, the third $N^+$ diffusion region 118, the third $P^+$ diffusion region 114, the fourth $P^+$ diffusion region 130, the fourth $N^+$ diffusion region 134, the first trigger node 120 and the second trigger node 136 are insulated from each other by a plurality of shallow trench isolations (STIs) 140.

In this embodiment, the first trigger node 120 and the second trigger node 136 are $P^+$ diffusion regions respectively disposed in the first P-well 110 and the second P-well 126. This means the first STSCR 104 is a P-type substrate-triggered SCR (P-STSCR), and the second STSCR 106 is also a P-STSCR. The first trigger node 120 and the second trigger node 136 are electrically connected together for accepting the same trigger current.

Figure 3:
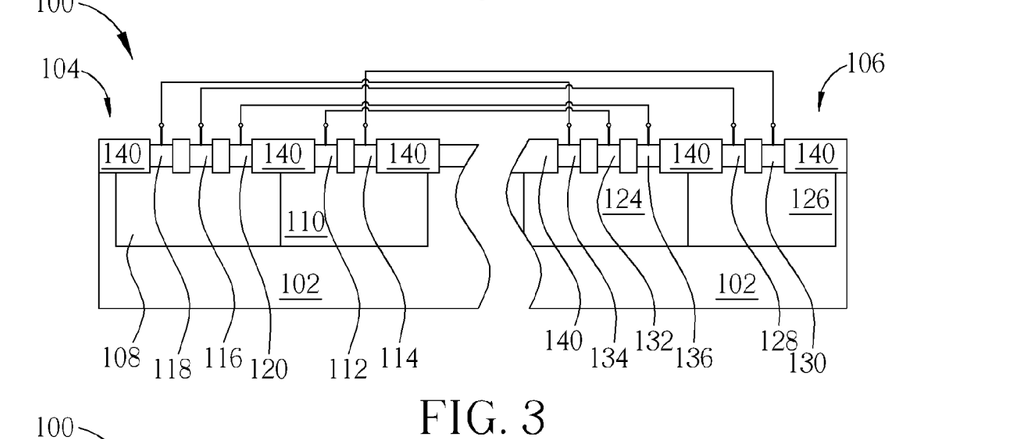
FIG. 3 is a cross-sectional schematic diagram illustrating an ESD protection device according to a second preferred embodiment of the present invention.
Figure 4:
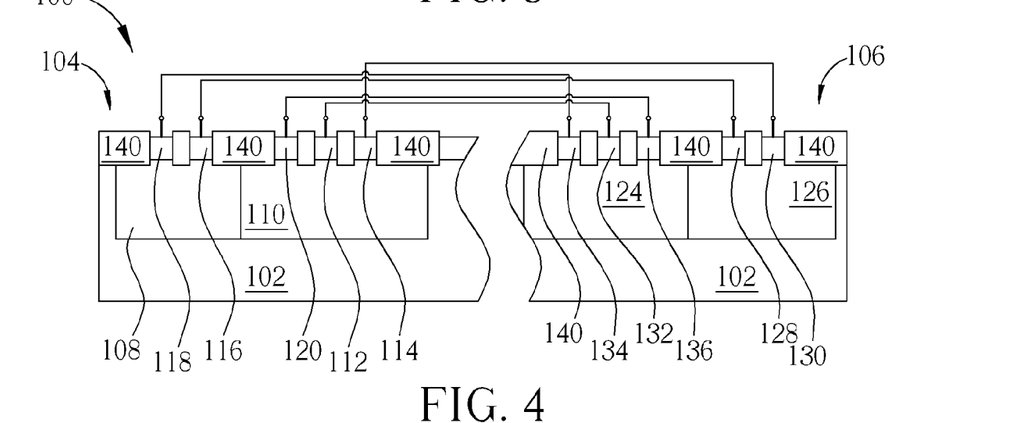
FIG. 4 is a cross-sectional schematic diagram illustrating an ESD protection device according to a third preferred embodiment of the present invention.

However, the first STSCR 104 and the second STSCR 106 of the present invention are not limited to be P-STSCRs. In order to describe conveniently, same devices use same labels, and same parts are not detailed redundant. Please refer to FIG. 3 and FIG. 4. FIG. 3 is a cross-sectional schematic diagram illustrating an ESD protection device according to a second preferred embodiment of the present invention, and FIG. 4 is a cross-sectional schematic diagram illustrating an ESD protection device according to a third preferred embodiment of the present invention. As shown in FIG. 3, the first STSCR 104 can be an N-type substrate-triggered SCR (N-STSCR), and the second STSCR 106 also can be an N-STSCR, which means the first trigger node 120 and the second trigger node 136 are $N^+$ diffusion regions respectively in the first N-well 108 and the second N-well 124. In this condition, the first trigger node 120 and the second trigger node 136 are also electrically connected together, and are drawn by the same trigger current. As shown in FIG. 4, the first STSCR 104 can be a P-STSCR, and the second STSCR 106 can be an N-STSCR. The first trigger node 120 is a $P^+$ diffusion region in the first P-well 110, and the second trigger node 136 is an $N^+$ diffusion region in second N-well 124. In this condition, the first trigger node 120 should be connected to the second trigger node 136 via an inverter (not shown), and the first trigger node 120 and the second trigger node 136 are not electrically connected to each other. In addition, it should be noted that the P-STSCR and the N-STSCR of present invention is not limited to the trigger node being disposed in the P-well and N-well. The trigger node of the P-STSCR also can be a $P^+$ diffusion region disposed between the P-well and the N-well in the P-STSCR. The trigger node of the N-STSCR also can be an $N^+$ diffusion region disposed between the P-well and the N-well in the N-STSCR.

Figure 5:
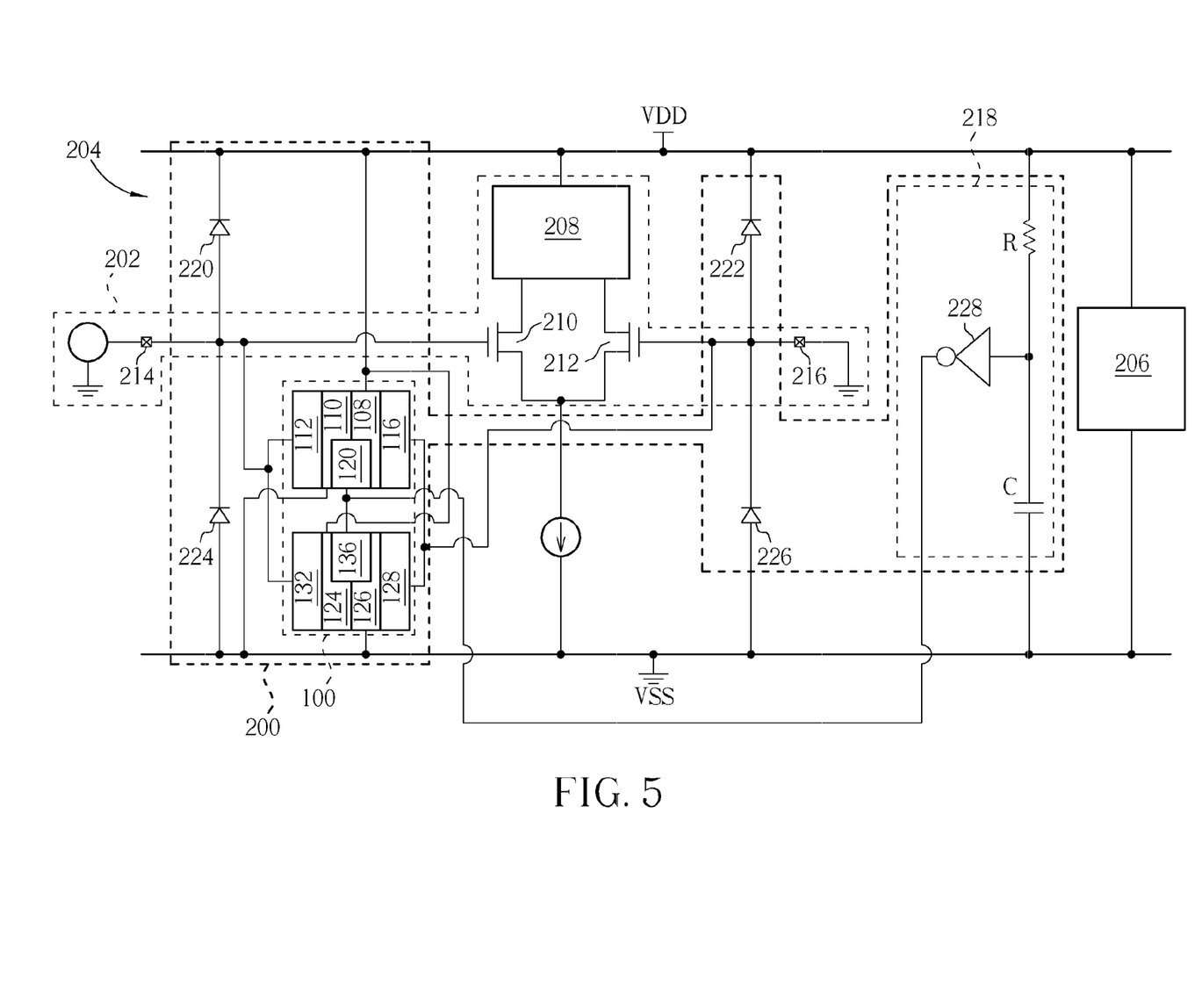
FIG. 5 is a schematic diagram illustrating an ESD protection circuit with the above-mentioned ESD protection device according to a first preferred embodiment of the present invention.

The present invention further provides an ESD protection circuit for protect a differential circuit with two differential input/output (I/O) pads. Please refer to FIG. 5. FIG. 5 is a schematic diagram illustrating an ESD protection circuit with the above-mentioned ESD protection device according to a first preferred embodiment of the present invention. As shown in FIG. 5, the ESD protection circuit 200 is electrically connected to a differential I/O stage 202 of an integrated circuit 204, a low power terminal VSS, a high power terminal VDD and a power-rail ESD clamp circuit 206. The differential I/O stage 202 includes a load circuit 208, two metal oxide semiconductor (MOS) transistors 210, 212, a first differential I/O pad 214 and a second differential I/O pad 216. The first differential I/O pad 214 is electrically connected to the gate electrode of the MOS transistor 210, and the second differential I/O pad 216 is electrically connected to gate electrode of the MOS transistor 212. The power-rail ESD clamp circuit 206 is electrically connected between the high power terminal VDD and the low power terminal VSS. In addition, the ESD protection circuit 200 includes the above-mentioned ESD protection device 100, an ESD-detection circuit 218. The first $N^+$ diffusion region 112 and the second $P^+$ diffusion region 132 of the ESD protection device 100 are electrically connected to the first differential I/O pad 214 and the gate electrode of the MOS transistor 210, and the first P-well 110 and the second P-well 126 of the ESD protection device 100 are electrically connected to the low power terminal VSS (through the third $P^+$ diffusion region 114 and the fourth $P^+$ diffusion region 130 respectively). The first $P^+$ diffusion region 116 and the second $N^+$ diffusion region 128 of the ESD protection device 100 are electrically connected to the second differential I/O pad 216 and the gate electrode of the MOS transistor 212, and the first N-well 108 and the second N-well 124 of the ESD protection device 100 are electrically connected to the high power terminal VDD (through the third $N^+$ diffusion region 118 and the fourth $N^+$ diffusion region 134 respectively). This embodiment takes the first STSCR 104 being a P-STSCR and the second STSCR 106 being a P-STSCR as an example. For this reason, the first trigger node 120 and the second trigger node 136 are $P^+$ diffusion regions respectively in the first P-well 110 and the second P-well 126, and the first trigger node 120 and the second trigger node 136 are electrically connected to the ESD-detection circuit 218 for accepting the same trigger current, but not limited to this.

In addition, the ESD protection circuit 200 further includes four diodes 220, 222, 224, 226 for providing ESD protection against the PS-mode, PD-mode, NS-mode and ND-mode ESD stresses. Two of the diodes 220, 222, which are constituted by a $P^+$ diffusion region and an N-well, are electrically connected between the first differential I/O pad 214 and the high power terminal VDD and between the second differential I/O pad 216 and the high power terminal VDD respectively. The other diodes 224, 226, which are constituted by an $N^+$ diffusion region and a P-well, are electrically connected between the first differential I/O pad 214 and the low power terminal VSS and between the second differential I/O pad 216 and the low power terminal VSS respectively. The present invention is not limited to only include one diode between a differential I/O pad and a power terminal, and the ESD protection circuit can also include at least one diode between a differential I/O pad and a power terminal. The differential I/O pad can be the first differential I/O pad or the second differential I/O pad, and the power terminal can be the high power terminal and the low power terminal.

In addition, the ESD-detection circuit 218 is designed to generate a trigger current into the first trigger node 120 and the second trigger node 136 during ESD stresses in order to quickly trigger on the first STSCR 104 and the second STSCR 106. In this embodiment, the ESD-detection circuit 218 includes a resistor R, a capacitor C and an inverter 228. An output node of the inverter 228 for providing the trigger current is electrically connected to the first trigger node 120 and the second trigger node 136. An input node of the inverter 228 electrically connected to the high power terminal VDD and the low power terminal VSS through the resistor R and the capacitor C respectively. With the RC delay provided by the resistor R and the capacitor C at the input node of the inverter 228, the input node of the inverter 228 is initially logic low, which causes the inverter 228 to be turned on to inject trigger current to trigger on the first and second STSCRs 104, 106. Therefore, the discharging path from the first differential I/O pad 214 to the second differential I/O pad 216 during pin-to-pin ESD stresses can be provided by the first and second STSCRs 104, 106 between the zapped first differential I/O pad 214 and the grounded second differential I/O pad 216.

Figure 6:
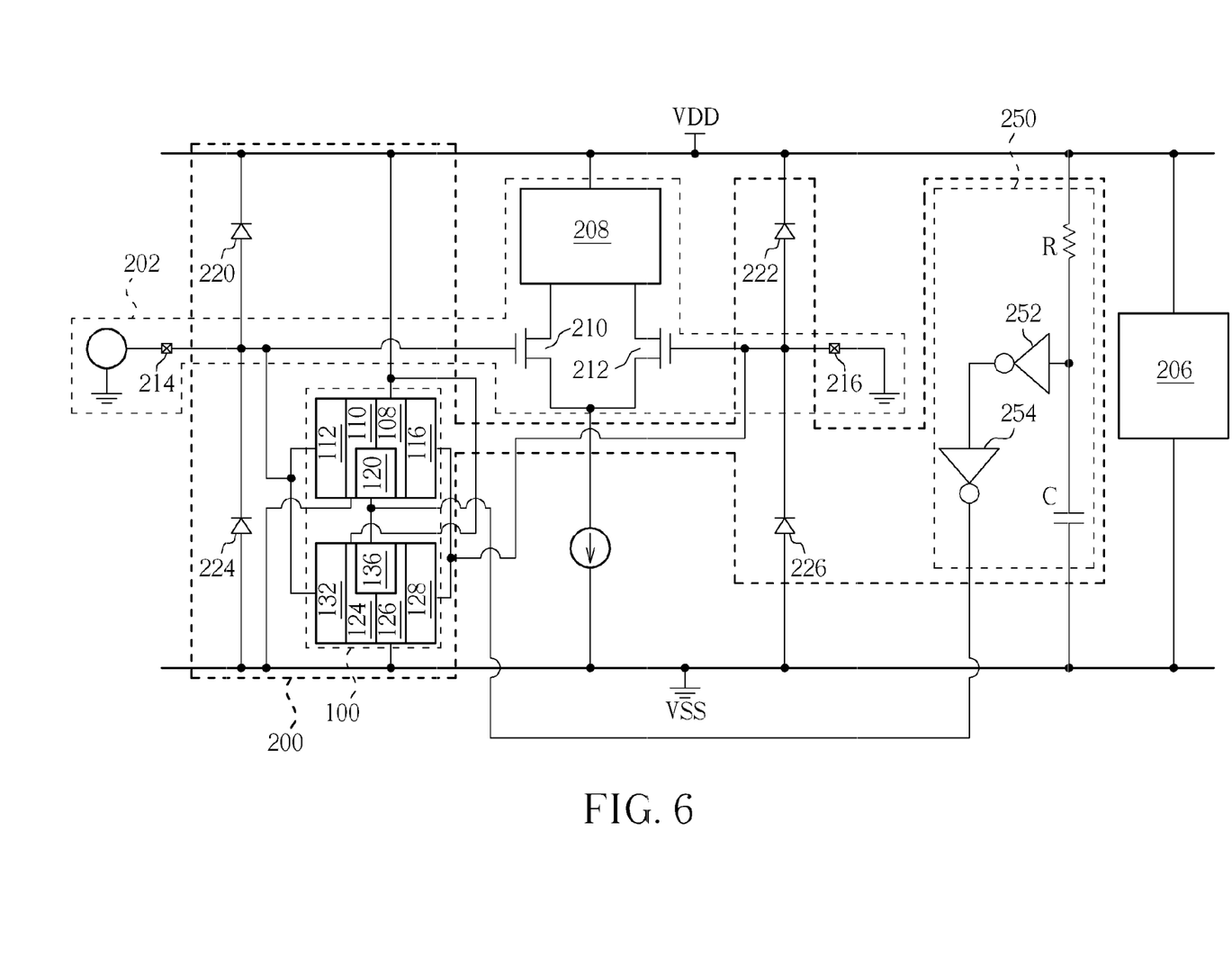
FIG. 6 is a schematic diagram illustrating an ESD protection circuit with the above-mentioned ESD protection device according to a second preferred embodiment of the present invention.
Figure 7:
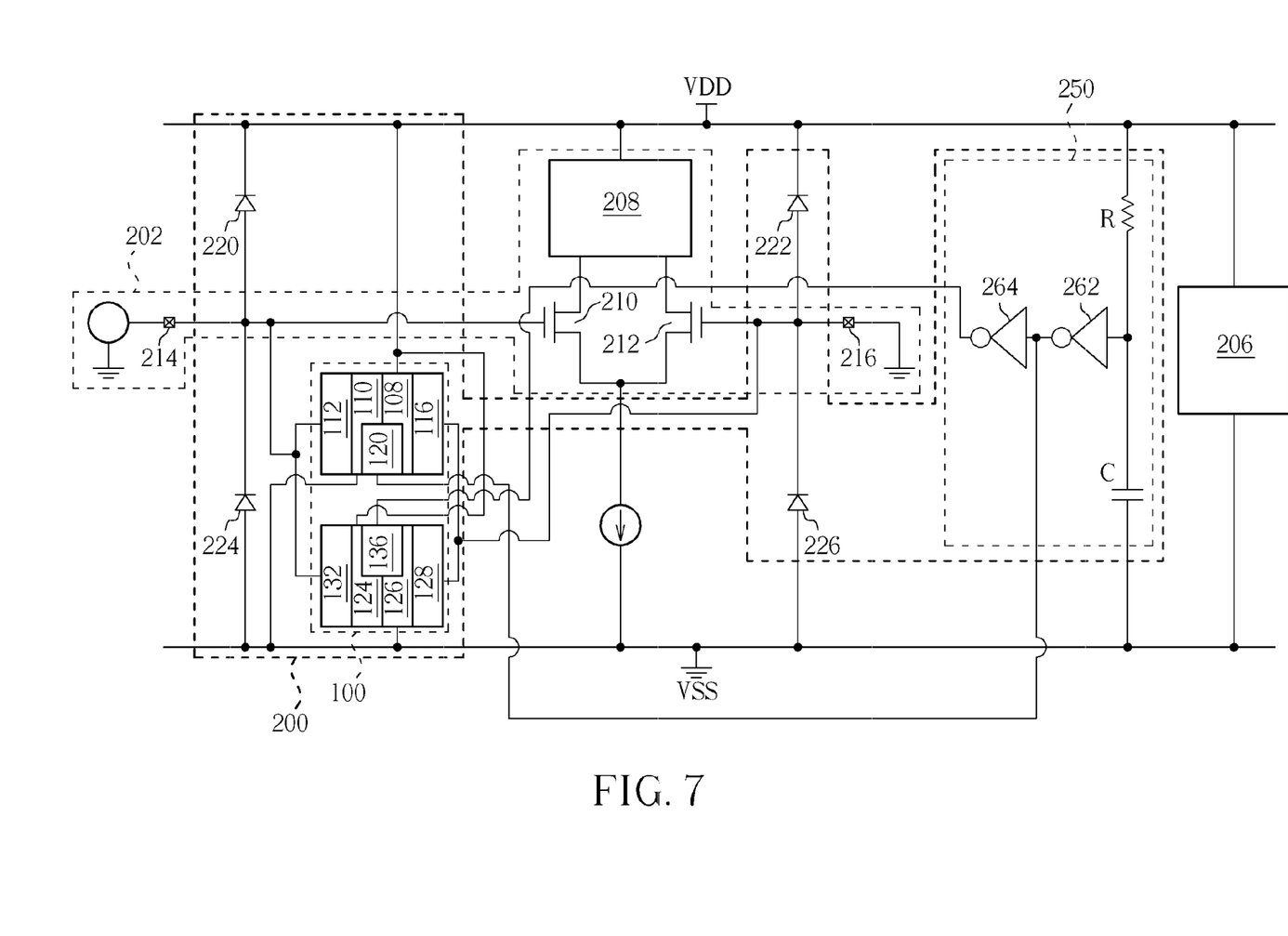
FIG. 7 is a schematic diagram illustrating an ESD protection circuit with the above-mentioned ESD protection device according to a third preferred embodiment of the present invention.

However, the ESD-detection circuit 218 of the present invention is not limited to include only one inverter, and the ESD-detection circuit can be designed according to the types of the first STSCR and the second STSCR. In order to describe conveniently, same devices use same labels, and same parts are not detailed redundant. Please refer to FIG. 6 and FIG. 7. FIG. 6 is a schematic diagram illustrating an ESD protection circuit with the above-mentioned ESD protection device according to a second preferred embodiment of the present invention, and FIG. 7 is a schematic diagram illustrating an ESD protection circuit with the above-mentioned ESD protection device according to a third preferred embodiment of the present invention. As shown in FIG. 6, when the first STSCR 104 and the second STSCR 106 are N-STSCRs, the ESD-detection circuit 250 includes a resistor R, a capacitor C, a first inverter 252 and a second inverter 254. An input node of the first inverter 252 is electrically connected to the high power terminal VDD and the low power terminal VSS through the resistor R and the capacitor C respectively, and an output node of the first inverter 252 is electrically connected to an input node of the second inverter 254. An output node of the second inverter 254 is electrically connected to the first trigger node 120 and the second trigger node 136 for drawing a trigger current. As shown in FIG. 7, when the first STSCR 104 is a P-STSCR and the second STSCR 106 is an N-STSCR, the ESD-detection circuit 260 includes a resistor R, a capacitor C, a first inverter 262 and a second inverter 264. An input node of the first inverter 262 is electrically connected to the high power terminal VDD and the low power terminal VSS through the resistor R and the capacitor C respectively, and an output node of the first inverter 262 is electrically connected to an input node of the second inverter 264 and the first trigger node 120 for injecting a trigger current. An output node of the second inverter 264 is electrically connected to the second trigger node 136 for drawing a trigger current. The above-mentioned ESD-detection circuit of the present invention is not meant to limit the scope of the present invention.

The detailed operations of the ESD protection circuit 200 can be described as follows: when an ESD stress occurs and the first differential I/O pad 214 has an ESD voltage, the four diodes 220, 222, 224, 226 can provide the ESD protection against the PS-mode, PD-mode, NS-mode and ND mode ESD stresses. Besides, during a pin-to-pin ESD stress between the first differential I/O pad 214 and the second differential I/O pad 216, an ESD current flows from the first differential I/O pad 214 via the diode 220 to the high power terminal VDD, and then flows to the ESD-detection circuit 218. The ESD-detection circuit 218 then generates the trigger current to trigger on the first STSCR 104 and the second STSCR 106. When the trigger current flows from the first and second trigger nodes 120, 136 into the first and second STSCRs 104, 106, the first and second STSCRs 104, 106 are triggered on into their latch states to provide a low impedance path to discharge the ESD current from the anodes of the first and second STSCRs 104, 106 to the cathodes of the first and second STSCRs 104, 106. Thereafter, the ESD current from the first differential I/O pad 214 can flow to the second differential I/O pad 216 via the second STSCR 106 or be drawn from the second differential I/O pad 216 via the first STSCR 104. Similarly, if the second differential I/O pad 216 has an ESD voltage, the ESD current can flow to the first differential I/O pad 214 via the first STSCR 104 or be drawn from the first differential I/O pad 214 via the second STSCR 106. Therefore, the pin-to-pin ESD current can be efficiently guided out, and the gate oxides of the MOS transistors 210, 212 can be protected from damage.

Figure 8:
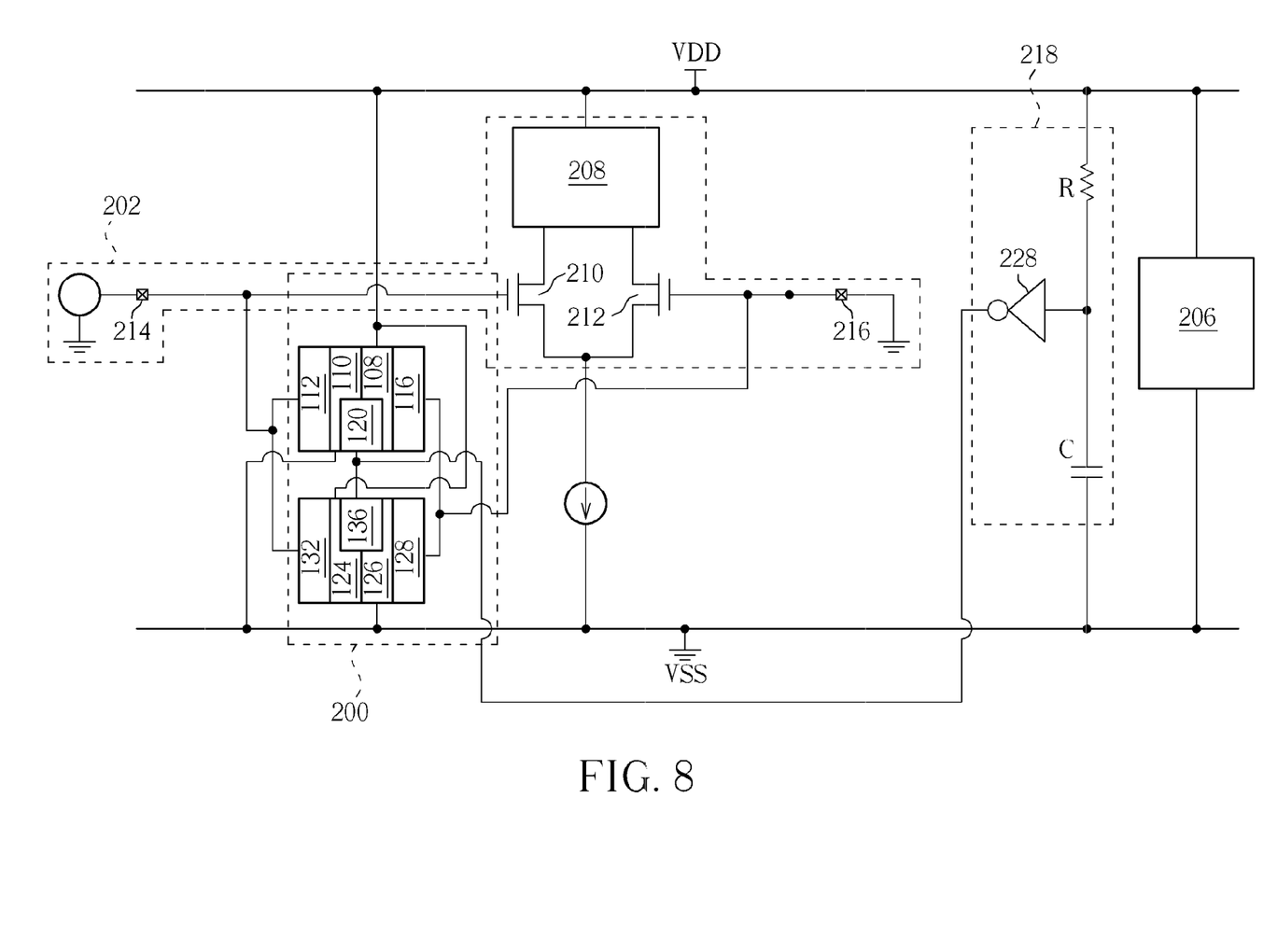
FIG. 8 is a schematic diagram illustrating an ESD protection circuit with the ESD protection device according to a fourth preferred embodiment of the present invention.

It should be noted that the ESD protection circuit of the present invention also can include no diode or at least one diode. Please refer to FIG. 8. FIG. 8 is a schematic diagram illustrating an ESD protection circuit with the ESD protection device according to a fourth preferred embodiment of the present invention. As shown in FIG. 8, as compared with the first preferred embodiment, the ESD protection circuit of this embodiment includes no diode. In this embodiment, the second $P^+$ diffusion region 132 is electrically connected to the first differential I/O pad 214 and the gate electrode of the MOS transistor 210, and the second N-well 124 is electrically connected to the high power terminal VDD, so that the second $P^+$ diffusion region 132 and the second N-well 124 can replace the diode 220 between the first differential I/O pad 214 and the high power terminal VDD in the first preferred embodiment. The first $N^+$ diffusion region 112 is electrically connected to the first differential I/O pad 214 and the gate electrode of the MOS transistor 210, and the first P-well 110 is electrically connected to the low power terminal VSS, so that the first $N^+$ diffusion region 112 and the first P-well 110 of this embodiment can replace the diode 224 between the first differential I/O pad 214 and the low power terminal VSS in the first preferred embodiment. The first $P^+$ diffusion region 116 is electrically connected to the second differential I/O pad 216 and the gate electrode of the MOS transistor 212, and the first N-well 108 is electrically connected to the high power terminal VDD, so that the first $P^+$ diffusion region 116 and the first N-well 108 of this embodiment can replace the diode 222 between the second differential I/O pad 216 and the high power terminal VDD in the first preferred embodiment. The second $N^+$ diffusion region 128 is electrically connected to the second differential I/O pad 216 and the gate electrode of the MOS transistor 212, and the second P-well 126 is electrically connected to the low power terminal VSS, so that the second P-well 126 and the second $N^+$ diffusion region 128 of this embodiment can replace the diode 226 between the second differential I/O pad 216 and the low power terminal VSS in the first preferred embodiment. Therefore, this embodiment use only two STSCRs to provide the ESD protection against the PS-mode, PD-mode, NS-mode and ND mode ESD stresses without further including the diodes and also against the pin-to-pin ESD stresses.

In addition, the ESD protection circuit of the present invention is not limited to use a device with the STSCR structure, and the ESD protection circuit can include a double PN junction in series, which provides the function the same as the P-STSCR or N-STSCR. Besides, the integrated circuit can be any kinds of the differential high-speed/high-frequency front-end circuits.

In summary, the present invention provides only two STSCR devices used for the two differential I/O pads of a differential I/O stage. The two STSCR devices can provide ESD protection against not only the PS-mode, PD-mode, NS-mode, and ND-mode ESD stresses, but also the pin-to-pin ESD stresses. Thus, as compared with the ESD protection circuit with four SCR devices of the prior art, the present invention can reduce about 50% of the layout area for ESD protection circuit, and reduce the pin-to-pin ESD current path to provide ESD protection for the gate oxides of the MOS transistors in the differential I/O stage.

Those skilled in the art will readily observe that numerous modifications and alterations of the device and method may be made while retaining the teachings of the invention.

What is claimed is:

1. An ESD protection device, comprising:
   a P-type substrate
   a first substrate-triggered silicon controlled rectifier (STSCR), disposed in the P-type substrate, the first STSCR comprising:
   a first N-well, disposed in the P-type substrate;
   a first P-well, disposed adjacent to the first N-well in the P-type substrate;
   a first $N^+$ diffusion region, disposed in the first P-well; a first $P^+$ diffusion region, disposed in the first N-well; and
   a first trigger node, disposed in the P-type substrate; and
   a second STSCR, disposed in the P-type substrate, the second STSCR comprising:
   a second N-well, disposed in the P-type substrate;
   a second P-well, disposed adjacent to the second N-well in the P-type substrate;
   a second $N^+$ diffusion region, disposed in the second P-well;
   a second $P^+$ diffusion region, disposed in the second N-well; and
   a second trigger node, disposed in the P-type substrate;
   wherein the first N-well is electrically connected to the second N-well, the first P-well is electrically connected to the second P-well, the second $N^+$ diffusion region is electrically connected to the first $P^+$ diffusion region, and the second $P^+$ diffusion region is electrically connected to the first $N^+$ diffusion region.

2. The ESD protection device of claim 1, wherein the first trigger node and the second trigger node are electrically connected to each other.

3. The ESD protection device of claim 1, wherein the first trigger node and the second trigger node are $P^+$ diffusion regions.

4. The ESD protection device of claim 1, wherein the first trigger node and the second trigger node are $N^+$ diffusion regions.

5. The ESD protection device of claim 1, wherein the first trigger node is a $P^+$ diffusion region and the second trigger node is an $N^+$ diffusion region.

6. The ESD protection device of claim 1, wherein the first STSCR further comprises a third $N^+$ diffusion region disposed in the first N-well and a third $P^+$ diffusion region disposed in the first P-well.

7. The ESD protection device of claim 1, wherein the second STSCR further comprises a fourth $N^+$ diffusion region disposed in the second N-well and a fourth $P^+$ diffusion region disposed in the second P-well.

8. The ESD protection device of claim 1, wherein the first $P^+$ diffusion region, the first N-well, the first P-well and the first $N^+$ diffusion region form a first lateral silicon controlled rectifier (lateral SCR).

9. The ESD protection device of claim 1, wherein the second $P^+$ diffusion region, the second N-well, the second P-well and the second $N^+$ diffusion region form a second lateral SCR.

10. An electrostatic discharge (ESD) protection circuit electrically connected to a differential stage with a first differential input/output (I/O) pad and a second differential I/O pad, a first power terminal, and a second power terminal, the ESD protection circuit comprising:

an ESD protection device of claim 1, wherein the first $N^+$ diffusion region and the second $P^+$ diffusion region are electrically connected to the first differential I/O pad, the first $P^+$ diffusion region and the second $N^+$ diffusion region are electrically connected to the second differential I/O pad, the first N-well and the second N-well are electrically connected to the first power terminal, and the first P-well and the second P-well are electrically connected to the second power terminal; and an ESD-detection circuit, electrically connected between the first power terminal and the second power terminal.

11. The ESD protection circuit of claim 10, wherein the ESD-detection circuit further comprises a resistor, a capacitor and an inverter.

12. The ESD protection circuit of claim 11, wherein the first STSCR and the second STSCR are P-type substrate-triggered silicon controlled rectifiers (P-STSCRs), an input node of the inverter is electrically connected to the first power terminal and the second power terminal through the resistor and the capacitor respectively, and an output node of the inverter is electrically connected to the first trigger node of the first STSCR and the second trigger node of the second STSCR.

13. The ESD protection circuit of claim 10, wherein the ESD-detection circuit comprises a resistor, a capacitor, a first inverter and a second inverter.

14. The ESD protection circuit of claim 13, wherein the first STSCR is a P-STSCR, and the second STSCR is an N-type substrate-triggered silicon controlled rectifier (N-STSCR), an input node of the first inverter is electrically connected to the first power terminal and the second power terminal through the resistor and the capacitor respectively, an output node of the first inverter is electrically connected to an input node of the second inverter and the first trigger node of the first STSCR, and an output node of the second inverter is electrically connected to the second trigger node of the second STSCR.

15. The ESD protection circuit of claim 13, wherein the first STSCR and the second STSCR are N-STSCRs, an input node of the first inverter is electrically connected to the first power terminal and the second power terminal through the resistor and the capacitor respectively, an output node of the first inverter is electrically connected to an input node of the second inverter, and an output node of the second inverter is electrically connected to the first trigger node of the first STSCR and the second trigger node of the second STSCR.

16. The ESD protection circuit of claim 10, further comprising at least one diode, electrically connected between the first differential I/O pad and the first power terminal.

17. The ESD protection circuit of claim 10, further comprising at least one diode, electrically connected between the second differential I/O pad and the first power terminal.

18. The ESD protection circuit of claim 10, further comprising at least one diode, electrically connected between the first differential I/O pad and the second power terminal.

19. The ESD protection circuit of claim 10, further comprising at least one diode, electrically connected between the second differential I/O pad and the second power terminal.

* * * * *